United States Patent
Novák et al.

(10) Patent No.: US 12,183,539 B2
(45) Date of Patent: Dec. 31, 2024

(54) INERT GAS SAMPLE TRANSFER FOR BEAM SYSTEMS

(71) Applicant: FEI Company, Hillsboro, OR (US)

(72) Inventors: Libor Novák, Brno (CZ); Petr Glajc, Brno (CZ); Marek Uncovský, Brno (CZ)

(73) Assignee: FEI Company, Hillsboro, OR (US)

( * ) Notice: Subject to any disclaimer, the term of this patent is extended or adjusted under 35 U.S.C. 154(b) by 378 days.

(21) Appl. No.: 17/589,791

(22) Filed: Jan. 31, 2022

(65) Prior Publication Data

US 2023/0245850 A1    Aug. 3, 2023

(51) Int. Cl.
*H01J 37/20* (2006.01)

(52) U.S. Cl.
CPC ....... *H01J 37/20* (2013.01); *H01J 2237/2007* (2013.01); *H01J 2237/20278* (2013.01)

(58) Field of Classification Search
CPC .............. H01J 37/20; H01J 2237/2007; H01J 2237/20278; H01J 37/185; H01J 37/32743; H01J 37/32788
See application file for complete search history.

(56) References Cited

U.S. PATENT DOCUMENTS

| | | | | |
|---|---|---|---|---|
| 6,365,024 B1* | 4/2002 | Li | ................... | G01N 27/44721 |
| | | | | 204/453 |
| 7,297,965 B2* | 11/2007 | Kidron | ................... | G01N 1/32 |
| | | | | 250/311 |
| 7,644,637 B2* | 1/2010 | Moore | ................... | H01J 37/185 |
| | | | | 73/863 |
| 8,357,913 B2* | 1/2013 | Agorio | ................... | G01N 1/32 |
| | | | | 250/311 |

(Continued)

FOREIGN PATENT DOCUMENTS

JP    2014-086250 A    5/2014

OTHER PUBLICATIONS

Anonymous, "PP3004 QuickLok," retrieved from URL: https://www.quorumtech.com/wp-content/uploads/2021/07/PP3004-5-6-brochure-V4.pdf, 4 pp. (downloaded on May 28, 2024).

(Continued)

*Primary Examiner* — David A Vanore
(74) *Attorney, Agent, or Firm* — Klarquist Sparkman, LLP

(57) ABSTRACT

Various approaches are provided for transferring samples within an inert gas environment to and from a beam system. In one example, a sample transfer capsule includes a container configured to store a sample during transport, wherein the container is adjustable between a closed configuration and an open configuration, an inert gas storage chamber coupled to the container and configured to store an inert gas, and a valve coupled to the inert gas storage chamber and the container and configured to selectively allow the inert gas to flow from the inert gas storage chamber to the container when the container is in the closed configuration. In this way, samples may be maintained in an inert gas environment during transport and while beam system vacuum chambers are vented, thereby reducing exposure of the samples and subsequently reducing the rate of a chemical reaction, such as oxidation or nitridation, of the samples.

20 Claims, 11 Drawing Sheets

(56) References Cited

U.S. PATENT DOCUMENTS

| | | | | |
|---|---|---|---|---|
| 8,410,457 | B2* | 4/2013 | Terada | H01J 37/185 250/311 |
| 8,729,497 | B2* | 5/2014 | Nagakubo | H01J 37/20 250/311 |
| 8,878,147 | B2 | 11/2014 | Robinson | |
| 9,349,570 | B2* | 5/2016 | Agorio | G01N 1/286 |
| 9,449,785 | B2* | 9/2016 | Price | H01J 37/023 |
| 9,816,946 | B2* | 11/2017 | Stegmann | G01N 23/04 |
| 11,239,051 | B2* | 2/2022 | Yoshihara | H01J 37/28 |
| 2015/0233884 | A1* | 8/2015 | Burge | G01N 33/1826 422/51 |
| 2021/0270783 | A1* | 9/2021 | Cardin | G01N 35/1095 |
| 2023/0132874 | A1* | 5/2023 | Neelisetty | H01J 37/185 250/441.11 |
| 2023/0204525 | A1* | 6/2023 | Novak | H01J 37/18 378/82 |
| 2023/0245850 | A1* | 8/2023 | Novák | H01J 37/185 250/442.11 |
| 2023/0253176 | A1* | 8/2023 | Kuba | H01J 37/28 250/310 |

OTHER PUBLICATIONS

Anonymous, "Sample Transfer Shuttle for Zeiss FE-SEMs and SEM/AFM hybrid systems," retrieved from URL: https://web.archive.org/web/20160418161255/https://dme-spm.com/pdffiles/shuttle.pdf, 6 pp. (Apr. 18, 2016).

Extended European Search Report from GB Application No. 23154058.4, 5 pp., dated Jun. 19, 2023.

Tacke et al., "A versatile high-vacuum cryo-transfer system for cryo-microscopy and analytics," *Biophysical Journal* 110(4): 758-765 (Feb. 2016).

* cited by examiner

INERT GAS SAMPLE TRANSFER FOR BEAM SYSTEMS

FIELD

The disclosed technology relates to sample preparation for beam systems in general, and to the transfer of samples under an inert gas environment for beam systems in particular.

BACKGROUND

Charged particle beam systems, such as focused ion beam (FIB) systems and electron beam systems, are used to create and alter microscopic structures because the charged particle beams can be focused to a spot smaller than one-tenth of a micron. Such beam systems may be used to micro-machine material through sputtering, chemically-assisted ion beam etching, chemically-assisted electron beam etching, and so on, and furthermore may be used to directly deposit material on a sample. In this way, beam systems are useful for micrometer and nanometer-level fabrication of microelectromechanical systems (MEMS), semiconductors, and thin-film batteries.

SUMMARY

Various approaches are provided for transferring samples within an inert gas environment to and from a vacuum chamber of a beam system. In one example, an apparatus comprises a container configured to store a sample during transport, the container adjustable between a closed configuration and an open configuration, an inert gas storage chamber configured to store an inert gas, and a valve configured to selectively allow the inert gas to flow from the inert gas storage chamber to the container when the container is in the closed configuration. In this way, samples may be maintained in an inert gas environment during transport and while beam system vacuum chambers are vented to atmosphere, thereby reducing exposure of the samples to atmosphere and subsequently reducing the possibility or the rate of a chemical reaction of the samples, such as oxidation or nitridation of the samples.

The foregoing and other objects, features, and advantages of the disclosed technology will become more apparent from the following detailed description, which proceeds with reference to the accompanying figures.

DETAILED DESCRIPTION

Figure 1:
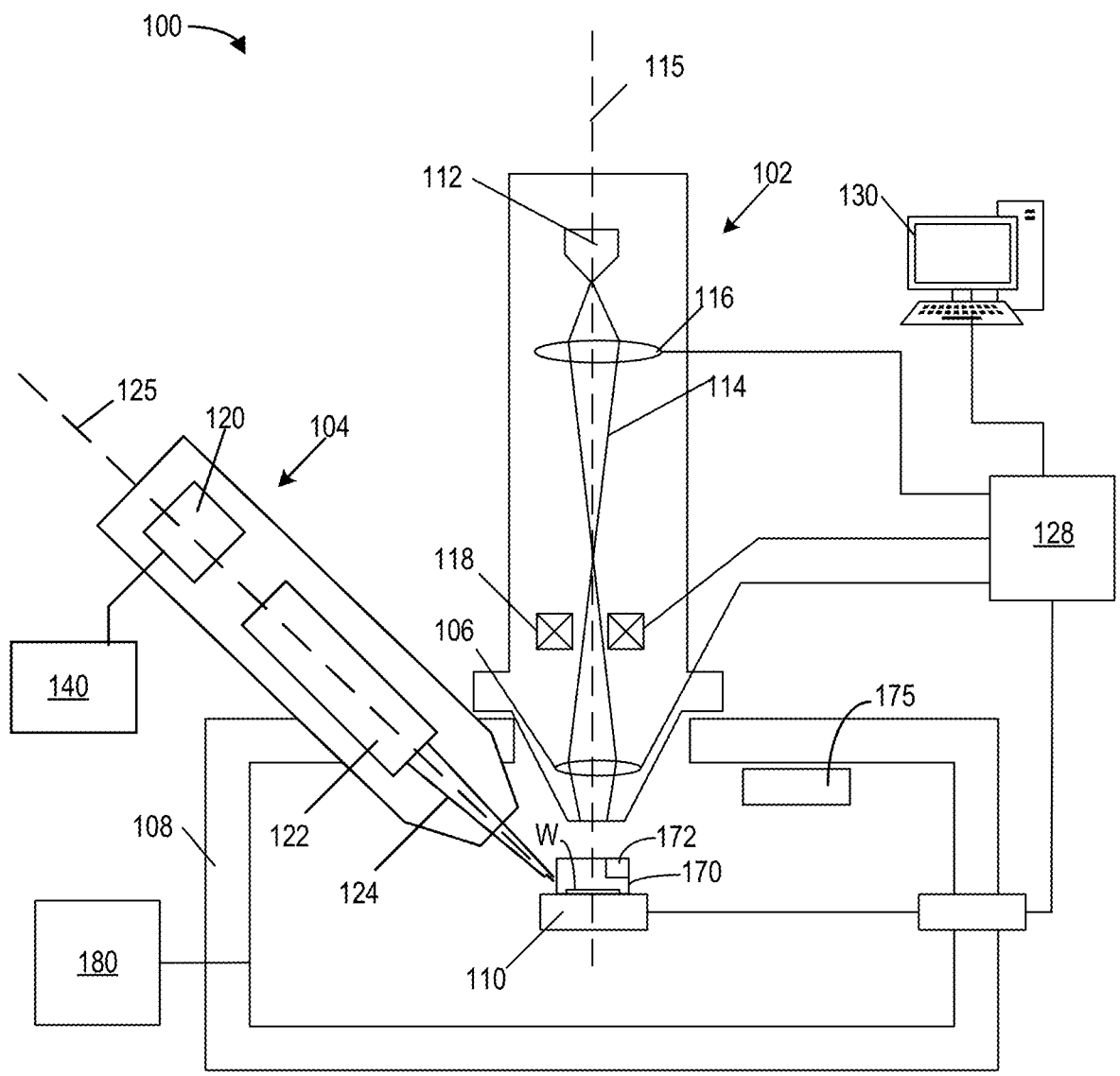
FIG. 1 shows a block diagram illustrating an example beam system, according to an example.

The present disclosure relates to transferring samples for beam systems. In particular, systems, apparatuses, and methods are provided for transferring samples under an inert gas environment for beam systems. Samples may be imaged and processed using charged particle beam systems, such as the dual-beam system depicted in FIG. 1. Although such beam systems include vacuum chambers that are pumped to a vacuum while a sample is being investigated or processed by the beam system, the sample may be susceptible to unwanted chemical changes, such as oxidation or nitridation, when exposed to air. As described further herein, a sample transfer capsule may maintain samples completely immersed in an inert gas such as argon to preserve the sample. The sample transfer capsule allows the sample to be exposed within the vacuum chamber for imaging and/or processing when the vacuum chamber is evacuated. Further, to continue preserving the sample when removing the sample from the vacuum chamber, the sample transfer capsule includes a built-in inert gas storage chamber storing the inert gas so that the sample transfer capsule may fill itself with the inert gas while the capsule is sealed within the vacuum chamber. The sample transfer capsule may fill itself by controlling a valve between a container of the sample transfer capsule and the inert gas storage chamber, wherein samples may be stored in the container. In some examples, the valve may be adjusted between an open position and a closed position by adjusting a position of a stage in the vacuum chamber of the charged particle beam system. The inert gas storage chamber may be attached to the rest of the sample transfer capsule when the sample transfer capsule is removed from the charged particle beam system. Furthermore, the container of the sample transfer capsule is configured to store samples during transfer and is adjustable between an open configuration and a closed configuration. The container is in fluidic communication with a volume surrounding the sample transfer capsule, such as a vacuum chamber or atmosphere, when the container is in the open configuration, and the container is not in fluidic communication with the volume surrounding the sample transfer capsule when the container is in the closed configuration. In other words, the container of the sample transfer capsule may be sealed from external fluidic communication in the closed configuration and unsealed from external fluidic communication in the open configuration. Additionally, as discussed further herein, samples stored within the sample transfer capsule may be directly irradiated by a charged particle beam when the container is in the open configuration, while the samples may not be directly irradiated by a charged particle beam when the container is in the closed configuration. One example of a sample transfer capsule, such as the sample transfer capsule depicted in FIG. 2, may seal the sample within the capsule based on pressure of inert gas within the capsule relative to the surrounding air pressure. A method for transferring samples to and from a beam system, such as the method depicted in FIGS. 3 and 4, may thus include pumping the vacuum chamber to open the sample transfer capsule. Another example of a sample transfer capsule, such as the sample transfer capsule depicted in FIG. 5, may seal the sample within the capsule by moving a platform onto a body of the sample transfer capsule, for example by locking the platform onto the body, for example by screwing the platform onto the body. A method for transferring samples to and from a beam system, such as the method depicted in FIGS. 6 and 7, may therefore include moving the platform of the capsule relative to the body of the capsule, for example by rotating and unscrewing the platform, to unlock the sample transfer capsule and thus open the sample transfer capsule. Yet another example of a sample transfer capsule, such as the sample transfer capsule depicted in FIGS. 8-10, may include a motor for actuating the cover of the sample transfer capsule. A method for transferring samples to and from a beam system with such a sample transfer capsule, such as the method depicted in FIG. 11, may therefore include controlling the sample transfer capsule to selectively open and close the cover as well as to selectively control a valve to fill the capsule with inert gas.

Referring to FIG. 1, in a representative example, a multi-beam system can be configured as a dual-beam system 100 comprising a scanning electron microscope (SEM) generally indicated at 102 and an ion beam column generally indicated at 104. The SEM 102 can comprise one or more charged particle beam (CPB) lenses such as a condenser lens 116 and an objective lens 106. In some examples, one or more CPB lenses can be magnetic lenses, and particularly, the objective lens 106 can be a magnetic objective lens. The ion beam column 104 is arranged to provide a focused ion beam (FIB) to a workpiece W, and the SEM 102 is situated for production of an image of the workpiece W. The workpiece W comprises a sample being imaged and/or processed which is transferred to and from the dual-beam system 100 via a sample transfer capsule 170 as described further herein.

The SEM 102 and the ion beam column 104 can be mounted to a vacuum chamber 108 housing a movable positioning system 110 for holding the workpiece W. The vacuum chamber 108 can be evacuated using vacuum pumps, such as the vacuum pump 180 coupled to the vacuum chamber 108. As discussed in further detail below, the positioning system 110 can be movable along the X-, Y-, and/or Z-axes as shown with respect to a coordinate system 150, wherein the Y-axis is perpendicular to the plane of the page, or alternatively along tilt (T) and rotation (R) axes. In some examples, the SEM 102 can be arranged vertically above the workpiece W and can be used to image the workpiece W, and the ion beam column 104 can be arranged at an angle and can be used to machine and/or process the workpiece W. FIG. 1 shows an exemplary orientation of the SEM 102 and the ion beam column 104 relative to the workpiece W.

The SEM 102 can comprise an electron source 112 and can be configured to manipulate a "raw" radiation beam from the electron source 112 and perform upon it operations such as focusing, aberration mitigation, cropping (using an aperture), filtering, etc. The SEM 102 can produce a beam 114 of input charged particles (e.g., an electron beam) that propagates along a particle-optical axis 115. The one or more lenses (e.g., CPB lenses) such as the condenser lens 116 and the objective lens 106 of the SEM 102 are configured to focus the beam 114 onto the workpiece W. In some examples, the SEM 102 can be provided with a deflection unit 118 that can be configured to steer the beam 114. For example, the beam 114 can be steered in a scanning motion (e.g., a raster or vector scan) across a sample being investigated or a workpiece to be processed.

The dual-beam system 100 can further comprise a computer processing capsule and/or a controller 128 for controlling, among other things, the deflection unit 118, charged particle beam (CPB) lenses 106, 116, and detectors (not shown), and for displaying information gathered from the detectors on a display unit. In some cases, a control computer 130 is provided to establish various excitations, record imaging data, and generally control operation of both the SEM and the FIB.

The ion beam column 104 can comprise an ion source (e.g., a plasma source 120) and ion beam optics 122. In the illustrated example, the ion beam column 104 is a plasma focused ion beam (PFIB), however, in other examples, the ion beam column 104 can be a standard focused ion beam (FIB) having a liquid metal ion source (LMIS), or any other ion source compatible with a focused ion beam column. The ion beam column 104 can produce and/or direct the ion beam 124 along an ion-optical axis 125. As mentioned above, the ion column 104 can be used to perform imaging, processing, and/or machining operations on the workpiece W, such as incising, milling, etching, depositing, and so on.

In examples wherein the ion beam is a PFIB, the ion source 120 can be fluidly coupled to a plurality of gases via a gas manifold 140 that includes gas sources coupled by respective valves to the ion source 120. During operation of the ion source 120, a gas can be introduced, where it becomes charged or ionized, thereby forming a plasma. Ions extracted from the plasma can then be accelerated through the ion beam column 104, becoming an ion beam. In other examples, the system 100 can comprise one or more lasers, or other types of milling or diagnostic tools.

Although a multi-beam system is described herein with regard to FIG. 1, it should be appreciated that in other illustrative and non-limiting examples, the sample may be transferred to a vacuum chamber of a charged particle beam system which has only an FIB column, other single-beam charged particle beam systems which comprise only a SEM or transmission electron microscope (TEM), or to a system equipped with a broad ion beam (BIB).

As mentioned above, such multi-beam systems can comprise a positioning system (e.g., a stage) 110 configured to hold and position the workpiece W. The positioning system 110 can position/move a carrier element in multiple degrees of freedom, including linear movement (e.g., to choose a particular area for analysis on a workpiece) and/or angular or rotational movement (e.g., to achieve a selected angle of the workpiece relative to an instrument).

As described hereinabove, the workpiece W may be susceptible to a chemical reaction of the samples, such as oxidation or nitridation in air. Although the vacuum chamber 108 is evacuated using vacuum pumps 180 as mentioned hereinabove, the workpiece W may be exposed to air when transferring the workpiece W to the vacuum chamber 108 and prior to evacuating the atmosphere of the vacuum chamber 108, as well as when removing the workpiece W from the vacuum chamber 108. To avoid a chemical reaction of the samples, such as oxidation or nitridation of the workpiece W, the workpiece W may be transferred into and out of the vacuum chamber 108 via a sample transfer capsule 170 that stores the workpiece W in an inert gas environment. For example, the sample transfer capsule 170 may store the workpiece W under argon or another noble gas, though it should be appreciated that an inert compound gas may be used depending on the composition of the workpiece W. In order to secure the workpiece W in the inert gas environment prior to venting the vacuum chamber 108 so that the sample transfer capsule 170 may be removed from the vacuum chamber 108, the sample transfer capsule 170 includes an inert gas storage chamber 172 configured to fill with the inert gas a compartment or container defining a volume for storing the workpiece W.

In some examples, the workpiece W may be separated from the sample transfer capsule 170 during imaging and/or processing with the dual-beam system 100, for example. For example, the sample transfer capsule 170 may be docked to a holder 175 mounted in the vacuum chamber 108. Example systems and methods for such a sample transfer capsule 170 are described further herein with regard to FIGS. 2-7. In other examples, the sample transfer capsule 170 may mount to the positioning stage 110 and may hold the workpiece W during imaging and/or processing with the dual-beam system 100. Example systems and methods for such a sample transfer capsule 170 are described further herein with regard to FIGS. 8-11.

Figure 2:
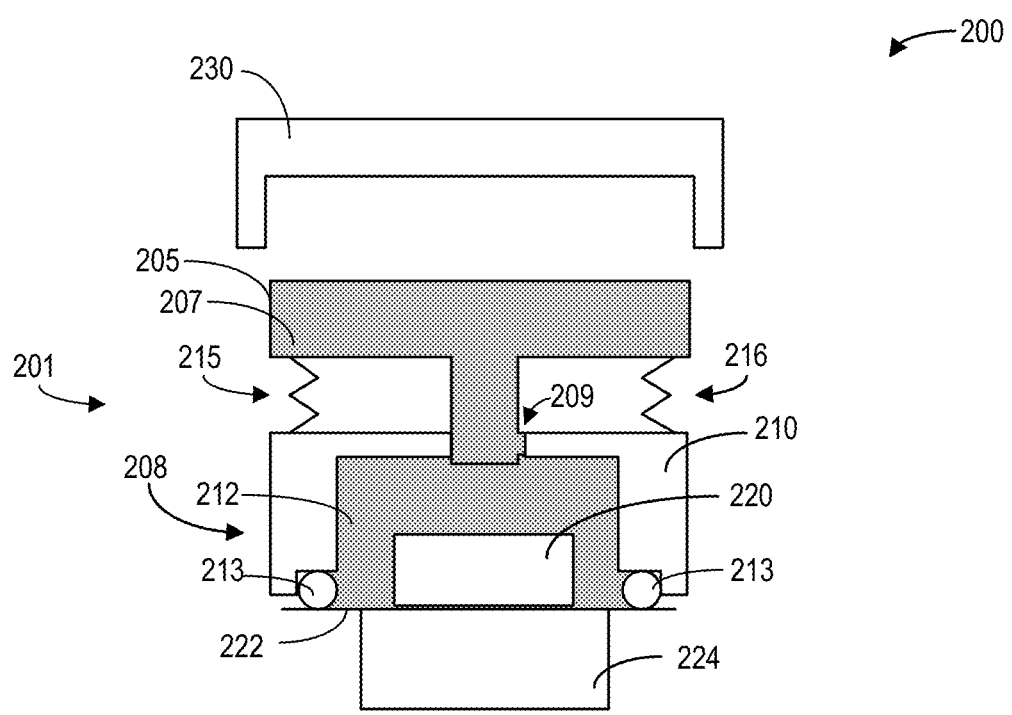
FIG. 2 shows a block diagram illustrating an example sample transfer capsule, according to an example.

FIG. 2 shows a block diagram illustrating an example system 200 for a sample transfer capsule 201, according to an example. The sample transfer capsule 201 comprises an inert gas container 205 storing an inert gas 207 such as argon. The sample transfer capsule 201 further comprises a container 208 for storing a sample 220, which may comprise the workpiece W described hereinabove. In particular, the container 208 comprises a housing or body 210 forming a sample volume 212 for storing the sample 220. As depicted, the body 210 forms the container 208 defining the sample volume 212 with an open portion comprising a side of the sample volume 212 that is not enclosed by the body 210. The sample transfer capsule 201 further comprises a sample holder or platform 222 upon which the sample 220 is positioned. The space between the body 210 and the platform 222 may be sealed by a gasket 213, which may comprise an O-ring as an illustrative and non-limiting example. In this way, the platform 222 is configured to cover the open portion of the sample volume 212 and seal the sample volume in a closed configuration, and the platform 222 is removable from the body 210 to unseal the sample volume 212.

The sample transfer capsule 201 further comprises a valve 209 configured to allow the inert gas 207 in the inert gas container 205 to flow into the sample volume 212 when the valve 209 is in an open position. In some examples, the sample transfer capsule 201 may further comprise one or more valve springs 215 and 216 configured to exert pressure between the inert gas container 205 and the body 210 to thereby hold the valve 209 in the closed position as depicted. In the closed position, inert gas 207 does not flow from the inert gas container 205 to the sample volume 212. However, it will be appreciated that a variety of valved connections may be used to couple and selectively allow transfer of the inert gas 207 from the inert gas container 205 to the sample volume 212.

As depicted, the sample transfer capsule 201 may be positioned on the stage 224 of the beam system, which may comprise the movable positioning system 110 as an illustrative example. Further, the sample transfer capsule 201 may be adapted to dock in a holder 230 of the system 200.

For example, the holder 230 may be positioned within the vacuum chamber 108 of the dual-beam system 100, and thus the holder 230 may comprise the holder 175. The holder 230 may be configured to grasp the sample transfer capsule 201 when the sample transfer capsule 201 is positioned within the holder 230. For example, the holder 230 may be electromechanically actuated to grasp the sample transfer capsule 201. As another example, the holder 230 may comprise a latch device that latches the sample transfer capsule 201 when the sample transfer capsule 201 is pressed upwards into the holder 230, wherein the latch device unlatches the sample transfer capsule 201 when the sample transfer capsule 201 is again pressed upwards into the holder 230. Such a latch device may be mechanically or electrically actuated, in different examples. As yet another example, the holder 230 and the sample transfer capsule 201 may be configured so that the sample transfer capsule 201 may be inserted to the holder 230 from one side, wherein the holder 230 is configured to secure the inert gas container 205 and the body 210 when the capsule 201 is inserted to the holder 230 such that the body 210 is detached from the platform 222 when the stage 224 lowers away from the holder 230.

Figure 3:
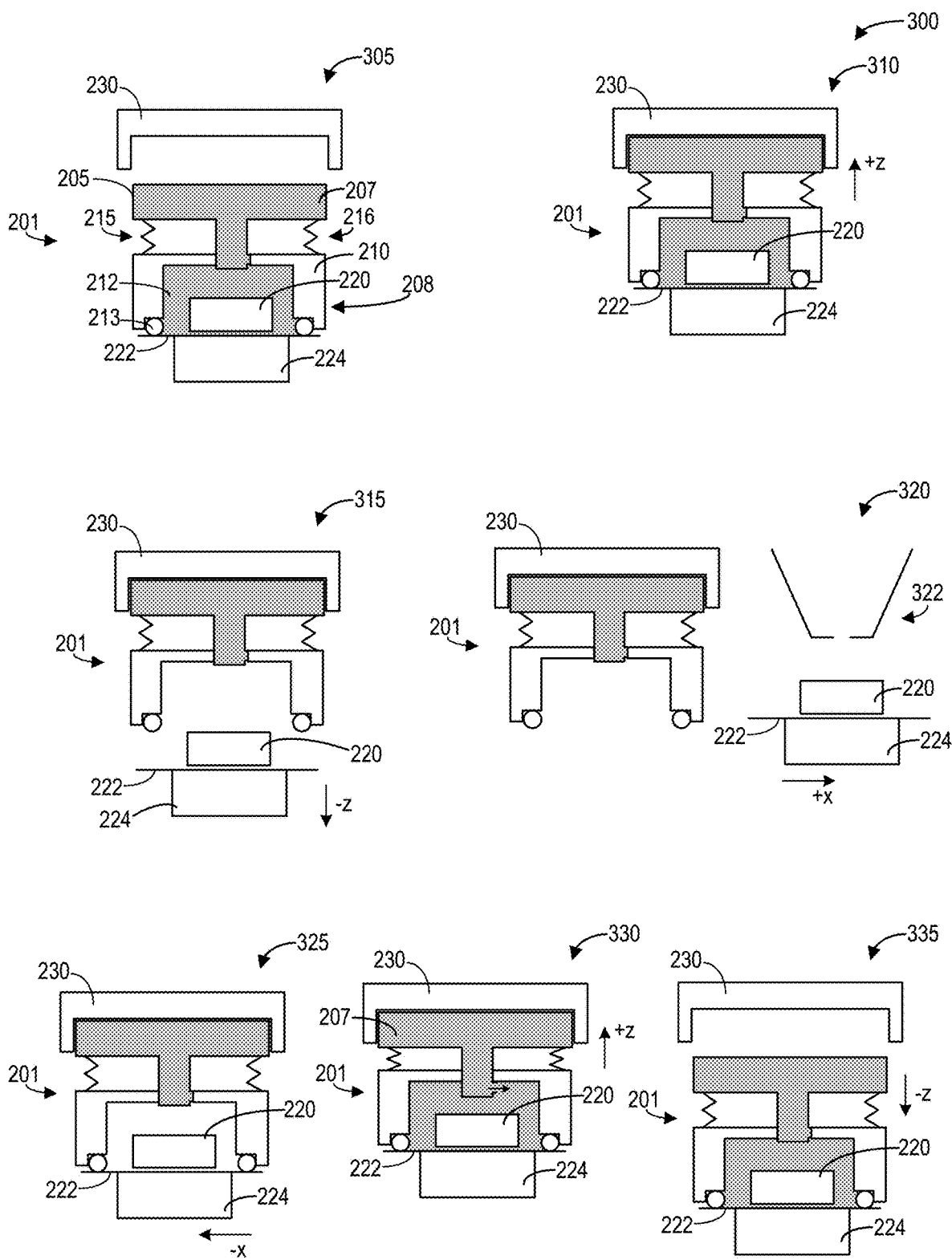
FIG. 3 shows a block diagram illustrating an example method for transferring a sample with the sample transfer capsule of FIG. 2 for imaging with a beam system, according to an example.

The movable stage 224 may be selectively moved within the vacuum chamber of the beam system to immerse the sample within an inert gas environment for transfer. As an illustrative example, FIG. 3 shows a block diagram illustrating an example method 300 for transferring a sample with the sample transfer capsule 201 for imaging with a beam system, such as the dual-beam system 100, according to an example.

Method 300 begins at 305. At 305, the sample transfer capsule 201 is positioned on the stage 224 within the vacuum chamber of a beam system, such as the vacuum chamber 108 of the dual-beam system 100. A sample 220 is positioned within the sample volume 212, wherein the sample volume 212 is filled with the inert gas 207 as depicted by the shaded region of the sample transfer capsule 201. The sample volume 212 may be filled with the inert gas 207 while the sample transfer capsule 201 is in a glove box, for example, and the pressure within the sample volume 212 may be less than one bar as an illustrative example. The upper part of the sample transfer capsule 201 (e.g., the body 210 and the inert gas container 205) and the lower part of the sample transfer capsule 201 (e.g., the platform 222) are pressed together and sealed via the gasket 213 by a pressure differential, such as the atmospheric pressure of the surrounding air, as the atmospheric pressure of the surrounding air is approximately one bar. The stage 224 is controlled to position the sample transfer capsule 201 under the holder 230.

At 310, the stage 224 moves in the upwards (e.g., +z) direction to dock the sample transfer capsule 201 within the holder 230. While the sample transfer capsule 201 is docked within the holder 230, the vacuum chamber is pumped to evacuate the air and thus reduce the pressure within the vacuum chamber. The resulting overpressure of the inert gas within the sample volume 212 relative to the vacuum chamber thus helps to open the sample transfer capsule 201.

Thus, at 315, the stage 224 is controlled to move in the downwards (e.g., −z) direction while the upper part of the sample transfer capsule 201 is docked in the holder 230. As the sample volume 212 is unsealed, the platform 222 and the sample 220 are released from the upper part of the sample transfer capsule 201. At 320, the stage 224 is controlled to move in a direction (e.g., +x direction as an illustrative and non-limiting example) to position the sample 220 within the beam path of the SEM column and/or FIB column 322. The sample 220 may thus be imaged and/or shaped by controlling the column 322.

After imaging and/or shaping the sample 220, the stage 224 is controlled at 325 to move back to the docked sample transfer capsule 201 (e.g., in the −x direction as an illustrative and non-limiting example). As depicted, the sample volume 212 is not filled with an inert gas. The sample volume 212 however is sealed by the gasket 213 and is at high vacuum around the sample 220.

At 330, the stage 224 is controlled to move in the upwards (e.g., +z) direction to open the valve 209 such that the inert gas 207 flows from the inert gas container 205 to fill the sample volume 212 surrounding the sample 220. As depicted, the upwards motion of the stage 224 compresses the springs 215 and 216 to open the valve 209. After filling the sample volume 212 with the inert gas 207, the total pressure in the sample volume 212 and the inert gas container 205 is slightly less than one bar. The vacuum chamber of the beam system is then vented until the surrounding pressure reaches atmospheric pressure (e.g., one bar), thereby sealing sample volume 212 and holding the sample transfer capsule 201 together.

At 335, the stage 224 is controlled to move in the downwards (e.g., −z) direction away from the holder 230 to remove the sample transfer capsule 201 from the holder 230. The sample transfer capsule 201 may then be removed from the vacuum chamber, for example to transfer the sample 220 to a glove box, another beam system, an ion polisher, or another system, wherein the sample 220 is maintained within the inert gas environment of the sealed sample volume 212 during such transfer.

Figure 4:
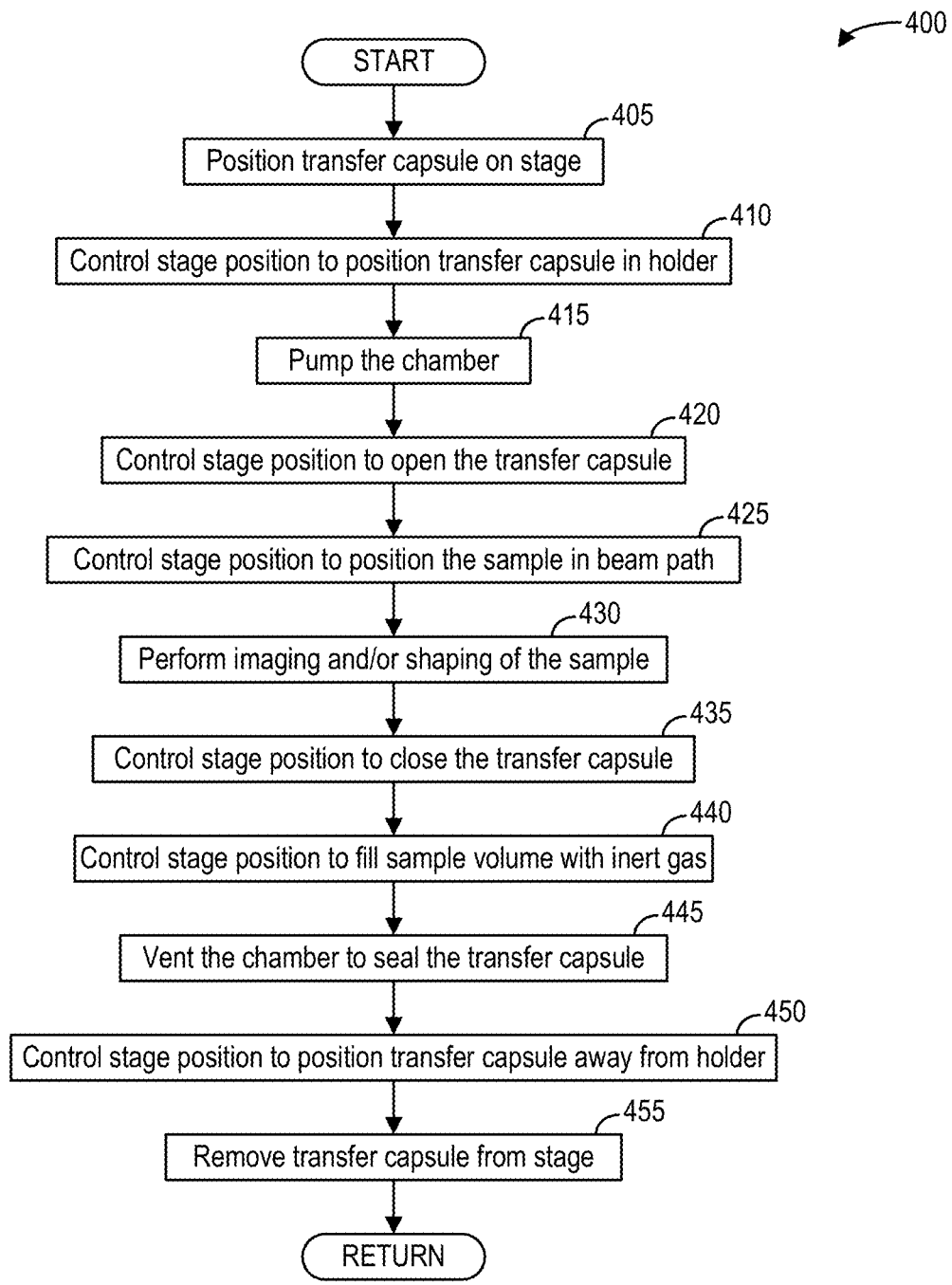
FIG. 4 shows a high-level flow chart illustrating an example method for transferring a sample with the sample transfer capsule of FIG. 2 for imaging with a beam system, according to an example.

To further illustrate how the sample transfer capsule 201 may be used to transfer samples under an inert gas environment, FIG. 4 shows a high-level flow chart illustrating an example method 400 for transferring a sample with the sample transfer capsule 201 for imaging and/or shaping with a beam system, such as the dual-beam system 100, according to an example. Method 400 may be implemented as executable instructions stored in non-transitory memory of the controller 128 that when executed by the controller 128 cause the controller 128 to perform the actions described herein, as an illustrative and non-limiting example, though it should be appreciated that one or more of the actions may be performed manually by an operator of the beam system as discussed further herein.

Method 400 begins at 405. At 405, method 400 positions the sample transfer apparatus or sample transfer capsule on the stage of the beam system. The sample transfer capsule may be manually positioned on the stage of the beam system, for example by an operator, or in automated settings the sample transfer capsule may be automatically positioned on the stage of the beam system via a robotic arm as an example. The sample transfer capsule includes a sample to be imaged and/or shaped or otherwise processed with the beam system, and the sample is immersed within an inert gas such as argon in the sample transfer capsule, wherein the inert gas pressure in the sample volume is less than atmospheric pressure such that the sample transfer capsule is sealed due to the higher atmospheric pressure of the surrounding air.

At 410, method 400 controls the stage position to position the transfer capsule or sample transfer capsule in a holder of the beam system, such as the holder 175 or 230. The sample transfer capsule may be docked in the holder such that the holder grasps or latches onto the sample transfer capsule. At 415, method 400 pumps the vacuum chamber, for example using one or more vacuum pumps 180, until the vacuum chamber reaches a vacuum pressure. The sample transfer capsule begins to unseal once the pressure of the vacuum chamber is less than the inert gas pressure within the sample volume of the sample transfer capsule, due to the overpressure of the inert gas within the sample volume. At 420, method 400 controls the stage position to open the sample transfer capsule or sample transfer apparatus, for example by lowering the platform 222 with the sample 220 positioned thereon away from the rest of the sample transfer capsule 201.

At 425, method 400 then controls the stage position to position the sample in the beam path of the beam system. Thereafter, at 430, method 400 controls the beam system to perform imaging and/or shaping of the sample.

Once imaging and/or other processing of the sample is complete, method 400 continues to 435. At 435, method 400 controls the stage position to close the sample transfer capsule or sample transfer apparatus, for example by moving the platform 222 with the sample 220 positioned thereon back to the upper portion of the sample transfer capsule 201 and pressing the platform 222 against the body 210 and/or the gasket 213. At 440, method 400 then controls the stage position to fill the sample volume with an inert gas such as argon. For example, method 400 may control the stage position to move upwards, thereby compressing the valve springs 215 and 216 to open the valve 209 so that the inert gas 207 flows from the inert gas container 205 to the sample volume 212. Method 400 may press upwards for a threshold amount of time to allow the sample volume 212 to fill with the inert gas 207, for example, and then cease pressing upwards to hold the valve 209 open once the threshold amount of time elapses. Alternatively, it should be appreciated that the pressure of the sample volume 212 may be monitored via a pressure sensor to determine when the sample volume reaches the desired inert gas pressure, at which point method 400 may cease pressing upwards to hold the valve 209 open. In some examples, the inert gas container 205 can store sufficient argon for multiple pressurization cycles and/or capsule transfers before refilling, e.g., multiple bars of the inert gas 207.

After filling the sample volume with the inert gas, method 400 continues to 445, wherein method 400 vents the vacuum chamber to atmospheric pressure, thereby sealing the sample transfer apparatus or transfer capsule due to the relative pressures of the vacuum chamber and the sample volume. At 450, method 400 controls the stage position to position the sample transfer capsule away from the holder. At 455, method 400 removes the sample transfer apparatus or transfer capsule from the stage. The sample transfer capsule may be manually removed from the stage of the beam system, for example by an operator, or in automated settings the sample transfer capsule may be automatically removed from the stage of the beam system via the robotic arm mentioned hereinabove. Method 400 then returns.

Thus, a sample transfer capsule is provided wherein a sample is sealed within an inert gas environment due to inert gas pressure of the sample volume relative to the surrounding atmospheric pressure. The sample transfer capsule allows a sample to be transported to and from a vacuum chamber of a beam system while maintaining the sample within an inert gas environment, thereby reducing exposure of the sample to atmosphere.

Figure 5:
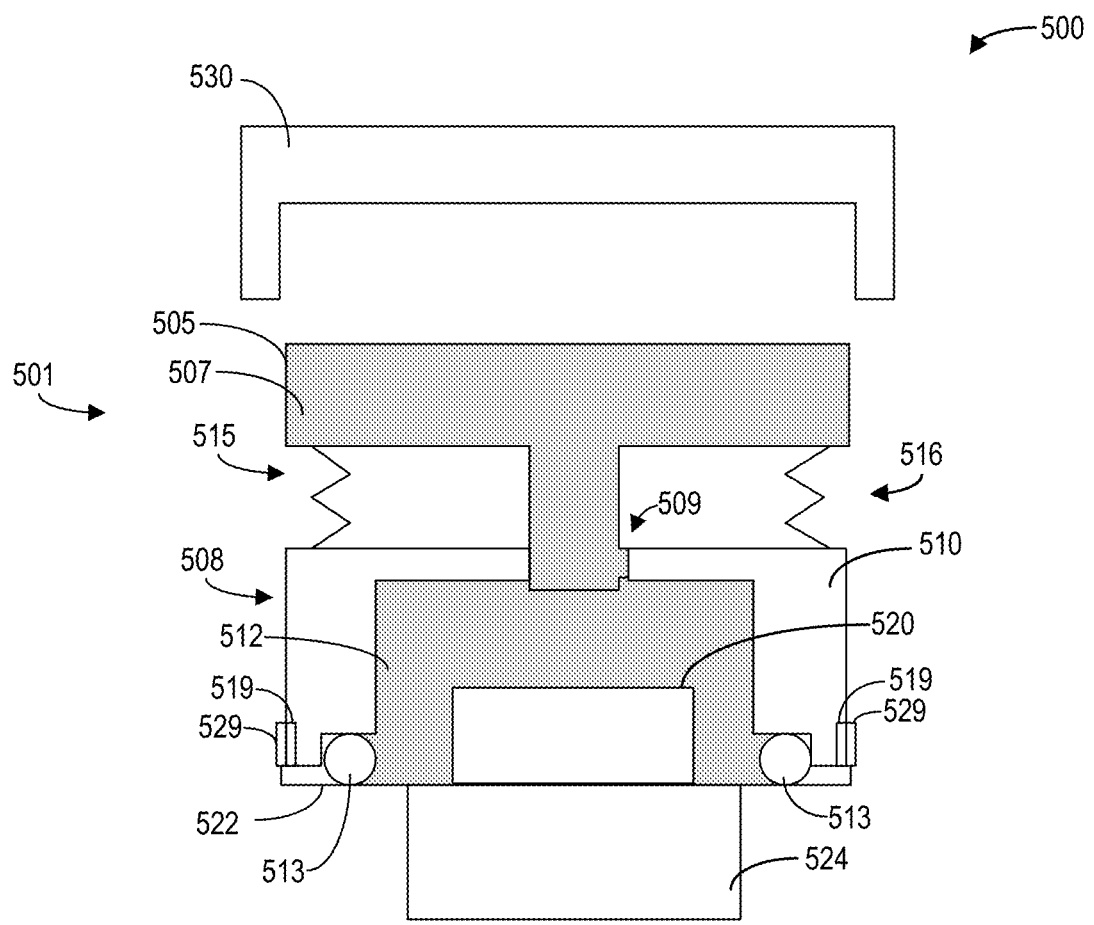
FIG. 5 shows a block diagram illustrating another example sample transfer capsule, according to an example.

Although the sample transfer capsule 201 seals the sample within the sample volume from atmosphere when the inert gas pressure is less than atmospheric pressure, in other examples a sample transfer capsule may seal a sample from atmosphere even when the inert gas pressure within the sample volume is above atmospheric pressure. As an illustrative and non-limiting example, FIG. 5 shows a block diagram illustrating an example system 500 for another sample transfer capsule 501, according to an example, that seals a sample 520 within a sample volume 512 regardless of the inert gas pressure within the sample volume 512. Similar to the sample transfer capsule 201, the sample transfer capsule 501 comprises an inert gas container 505 storing an inert gas 507 such as argon, and a container 508 comprising a housing or body 510 forming the sample volume 512 for storing the sample 520, which may comprise the workpiece W described hereinabove. The sample transfer capsule 501 further comprises a sample holder or platform 522 upon which the sample 520 is positioned. One side of the container 508 comprises an open portion or open side that is covered by the platform 522 when the container 508 of the sample transfer capsule 501 is in a closed configuration. In such a closed configuration, the space between the body 510 and the platform 522 may be sealed by a gasket 513, which may comprise an O-ring as an illustrative and non-limiting example, to seal the sample volume 512.

The sample transfer capsule 501 further comprises a valve 509 configured to allow the inert gas 507 in the inert gas container 505 to flow into the sample volume 512 when the valve 509 is in an open position. The sample transfer capsule 501 may further comprise one or more valve springs 515 and 516 configured to exert pressure between the inert gas container 505 and the body 510 to thereby hold the valve 509 in the closed position as depicted. In the closed position, inert gas 507 does not flow from the inert gas container 505 to the sample volume 512.

As depicted, the sample transfer capsule 501 may be positioned on the stage 524 of the beam system, which may comprise the movable positioning system 110 as an illustrative example. Further, the sample transfer capsule 501 may be adapted to dock in a holder 530 of the system 500. For example, the holder 530 may be positioned within the vacuum chamber 108 of the dual-beam system 100, and thus the holder 530 may comprise the holder 175. The holder 530 may be configured to grasp the sample transfer capsule 501 when the sample transfer capsule 501 is positioned within the holder 530. For example, the holder 530 may be electromechanically actuated to grasp the sample transfer capsule 501. As another example, the holder 530 may comprise a latch device that latches the sample transfer capsule 501 when the sample transfer capsule 501 is pressed upwards into the holder 530, wherein the latch device unlatches the sample transfer capsule 501 when the sample transfer capsule 501 is again pressed upwards into the holder 530. Such a latch device may be mechanically or electrically actuated, in different examples.

Further, the body 510 and the platform 522 comprise respective interlocking mechanisms 519 and 529 configured to interlock the body 510 and the platform 522. The interlocking mechanisms 519 and 529 may comprise mechanical interlocking mechanisms, such as threads, latches, bayonets, and so on, configured to mechanically interlock the body 510 and the platform 522 when the platform 522 is selectively moved and coupled to the body 510. For example, in examples wherein the interlocking mechanisms 519 and 529 comprise corresponding threads or corresponding helical structures, the platform 522 may be coupled to the body 510 by rotating the platform 522 relative to the body 510 such that the threads are in face-sharing contact. In other words, the platform 522 may be screwed onto the body 510 in some examples. For example, as the platform 522 couples to the body 510 via the interlocking mechanisms (e.g., threads) 519 and 529, the sample transfer capsule 501 may be sealed regardless of the relative pressure of the inert gas within the sample volume 512 to the surrounding atmosphere. Thus, the inert gas pressure within the sample volume 512 may be above one bar if desired. In other examples, the interlocking mechanisms 519 and 529 may comprise electromagnetic locks configured to lock the platform 522 to the body 510 when the interlocking mechanisms 519 and 529 are in face-sharing contact. For example, one of the interlocking mechanisms 519 or 529 may comprise an electromagnet while the other interlocking mechanism 519 or 529 may comprise an armature plate. In general, the interlocking mechanisms 519 and 529 are configured to mate and lock the platform 522 to the body 510 when the interlocking mechanisms 519 and 529 are selectively moved with respect to each other.

It should be appreciated that FIGS. 2 and 5 depict cross-sectional views of sample transfer capsules 201 and 501, respectively, and that the sample transfer capsules 201 and 501 may comprise a cylindrical shape, a rectangular shape, or another shape, as illustrative and non-limiting examples.

Figure 6:
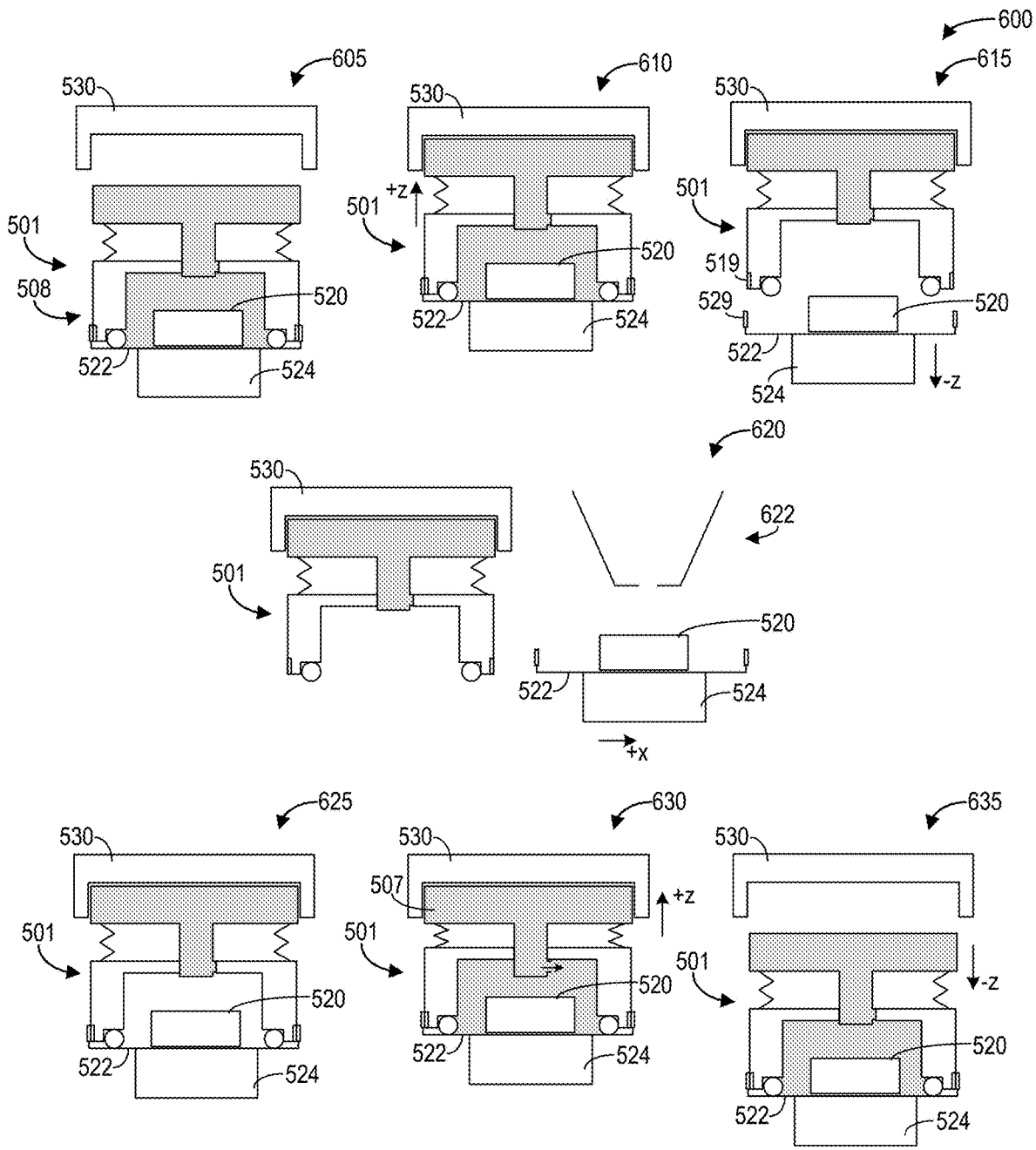
FIG. 6 shows a block diagram illustrating an example method for transferring a sample with the sample transfer capsule of FIG. 5 for imaging with a beam system, according to an example.

The movable stage 524 may be selectively moved within the vacuum chamber of the beam system to immerse the sample within an inert gas environment for transfer. Further, the movable stage 524 may be selectively moved to open and close the sample transfer capsule 501 by moving the platform 522 relative to the body 510 to lock the interlocking mechanisms 519 and 529, thereby locking the platform 522 to the body 510. As an illustrative example, FIG. 6 shows a block diagram illustrating an example method 600 for transferring a sample with the sample transfer capsule 501 for imaging with a beam system, such as the dual-beam system 100, according to an example.

Method 600 begins at 605. At 605, the sample transfer capsule 501 is positioned on the stage 524 within the vacuum chamber of a beam system, such as the vacuum chamber 108 of the dual-beam system 100. A sample 520 is positioned within the sample volume 512, wherein the sample volume 512 is filled with the inert gas 507 as depicted by the shaded region of the sample transfer capsule 501. The sample volume 512 may be filled with the inert gas 507 while the sample transfer capsule 501 is in a glove box, for example, and the pressure within the sample volume 512 may be less than one bar as an illustrative example, equal to one bar, or greater than one bar if desired. The upper part of the sample transfer capsule 501 (e.g., the body 510 and the inert gas container 505) and the lower part of the sample transfer capsule 501 (e.g., the platform 222) are coupled together via the interlocking mechanisms 519 and 529 and sealed via the gasket 513. The stage 524 is controlled to position the sample transfer capsule 501 under the holder 530.

At 610, method 600 moves the sample transfer capsule 501 in the upwards (e.g., +z) direction to dock the sample transfer capsule 501 in the holder 530. The vacuum chamber of the beam system may be pumped while docking the sample transfer capsule 501 in the holder 530 to evacuate the atmospheric gases from the vacuum chamber. While the holder 530 grasps the upper part of the sample transfer capsule 501, the stage 524 moves the platform 522 to unlock the platform 522 from the body 510 and thus open the sample transfer capsule 501. For example, if the interlocking mechanisms 519 and 529 comprise threads, the stage 524 may rotate and lower to unscrew the platform 522 from the body 510. At 615, method 600 controls the stage 524 to lower the platform 522 and the sample 520 in the downwards (e.g., −z) direction away from the upper part of the sample transfer capsule 501. Then, at 620, method 600 controls the stage 524 to position the sample 520 within the beam path of the beam column 622 for imaging and/or shaping, for example by translating the platform 522 (e.g., in the +x direction as a non-limiting example).

At 625, after imaging and/or shaping of the sample 520, method 600 controls the stage 524 to return the sample 520 and the platform 522 to the body 510 of the sample transfer capsule 501, for example by translating the platform 522 (e.g., in the −x direction as a non-limiting example) and raising the platform 522 in an upwards (e.g., +z) direction towards the body 510 docked in the holder 530. In particular, method 600 closes and seals the sample transfer capsule 501 by moving the stage 524 with the platform 522 thereon, such that the platform 522 is locked onto the body 510 via the interlocking mechanisms 519 and 529. As one example, method 600 may move the stage 524 to screw the platform 522 onto the body 510, in examples wherein the interlocking mechanisms 519 and 529 comprise corresponding threads.

At 630, method 600 controls the stage 524 to move in the upwards (e.g., +z) direction, thereby compressing the valve springs 515 and 516 to open the valve 509 so that the inert gas 507 flows from the inert gas container 505 to the sample volume 512. At 635, after filling the sample volume 512 with the inert gas 507, method 600 lowers the sample transfer capsule 501 in the downwards (e.g., −z) direction away from the holder 530. The sample transfer capsule 501 with the sample 520 sealed in an inert gas environment therein may then be removed from the stage 524 and thus from the beam system.

Figure 7:
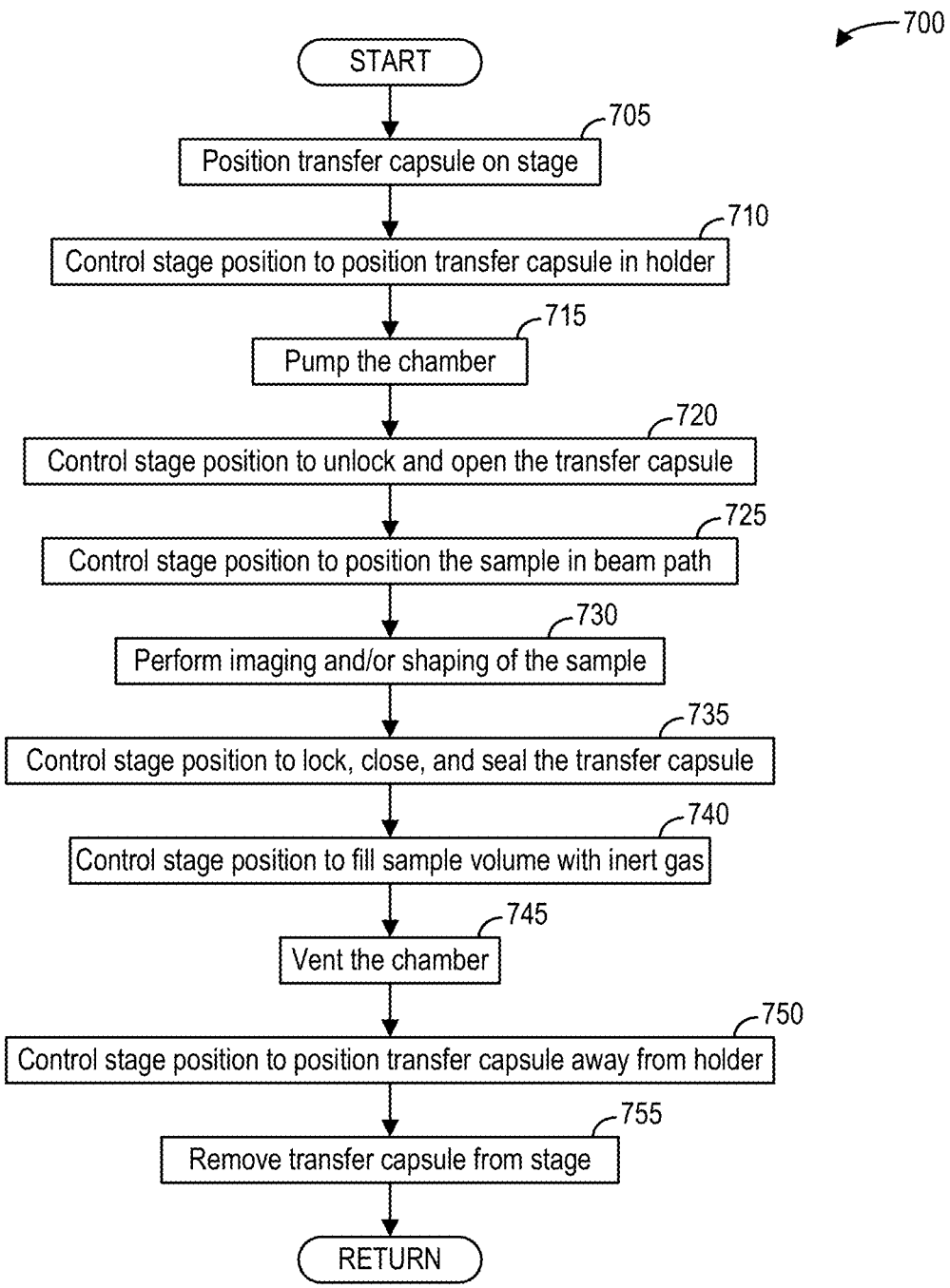
FIG. 7 shows a high-level flow chart illustrating another example method for transferring a sample with the sample transfer capsule of FIG. 5 for imaging with a beam system, according to an example.

To further illustrate how the sample transfer capsule 501 may be used to transfer samples under an inert gas environment, FIG. 7 shows a high-level flow chart illustrating an example method 700 for transferring a sample with the sample transfer capsule 501 for imaging and/or shaping with a beam system, such as the dual-beam system 100, according to an example. Method 700 may be implemented as executable instructions stored in non-transitory memory of the controller 128 that when executed by the controller 128 cause the controller 128 to perform the actions described herein, as an illustrative and non-limiting example, though it should be appreciated that one or more of the actions may be performed manually by an operator of the beam system as discussed further herein.

Method 700 begins at 705. At 705, method 700 positions the sample transfer apparatus or transfer capsule on the stage of the beam system. The sample transfer capsule may be manually positioned on the stage of the beam system, for example by an operator, or in automated settings the sample transfer capsule may be automatically positioned on the stage of the beam system via a robotic arm as an example. The sample transfer capsule, which may comprise the sample transfer capsule 501, stores a sample to be imaged and/or shaped or otherwise processed with the beam system, and the sample is immersed within an inert gas such as argon in the sample transfer capsule.

At 710, method 700 controls the stage position to position the transfer capsule or sample transfer apparatus in a holder of the beam system, such as the holder 175 or 530. The sample transfer capsule may be docked in the holder such that the holder grasps or latches onto the sample transfer capsule. At 715, method 700 pumps the vacuum chamber, for example using one or more vacuum pumps 180, to evacuate the atmosphere within the vacuum chamber. With the atmosphere evacuated from the vacuum chamber, the sample may be exposed within the vacuum chamber. To that end, at 720, method 700 controls the stage position to unlock and open the transfer capsule or sample transfer apparatus, for example by moving the platform 522 with the sample 520 positioned thereon to unlock the platform 522 from the body 510, and then lowering the platform 522 away from the body 510 of the sample transfer capsule 501. As one example, method 700 may move the platform by helically rotating or unscrewing the platform 522 from the body 510, in examples wherein the interlocking mechanisms 519 and 529 comprise threads. The inert gas dissipates in the vacuum chamber as the sample transfer capsule is opened, or in some examples the sample transfer capsule may be unsealed and opened while the vacuum pump 180 is pumping the vacuum chamber so that the inert gas is also evacuated from the vacuum chamber.

Continuing at 725, method 700 controls the stage position to position the sample in the beam path of the beam system. Thereafter, at 730, method 700 controls the beam system to perform imaging and/or shaping of the sample.

After imaging and/or other processing of the sample is complete, method 700 continues to 735. At 735, method 700 controls the stage position to lock, close, and thus seal the transfer capsule or sample transfer apparatus, for example by moving the platform 522 with the sample 520 positioned thereon back to the body 510 of the sample transfer capsule 501 and moving the platform 522 against the body 510 while moving upwards to lock the platform 522 onto the body 510. After closing and sealing the sample transfer capsule, at 740, method 700 then controls the stage position to fill the sample volume with an inert gas such as argon. For example, method 700 may control the stage position to move upwards, thereby compressing the valve springs 515 and 516 to open the valve 509 so that the inert gas 507 flows from the inert gas container 505 to the sample volume 512. Method 700 may control the stage to press upwards for a threshold amount of time to allow the sample volume 512 to fill with the inert gas 507, for example, and then cease pressing upwards to hold the valve 509 open once the threshold amount of time elapses. Alternatively, it should be appreciated that the pressure of the sample volume 512 may be monitored via a pressure sensor to determine when the sample volume reaches the desired inert gas pressure, at which point method 700 may discontinue controlling the stage to press upwards to hold the valve 509 open.

After filling the sample volume with the inert gas, method 700 continues to 745, wherein method 700 vents the vacuum chamber to atmospheric pressure. At 750, method 700 controls the stage position to position the sample transfer capsule away from the holder. At 755, method 700 removes the sample transfer apparatus or transfer capsule from the stage. The sample transfer capsule may be manually removed from the stage of the beam system, for example by an operator, or in automated settings the sample transfer capsule may be automatically removed from the stage of the beam system via the robotic arm mentioned hereinabove. Method 700 then returns.

Thus, a sample transfer capsule is provided wherein a sample is sealed within an inert gas environment by mechanically or electromagnetically locking a platform onto a body of the capsule. The sample transfer capsule allows a sample to be transported to and from a vacuum chamber of a beam system while maintaining the sample within an inert gas environment, thereby reducing exposure of the sample to atmosphere.

Figure 8:
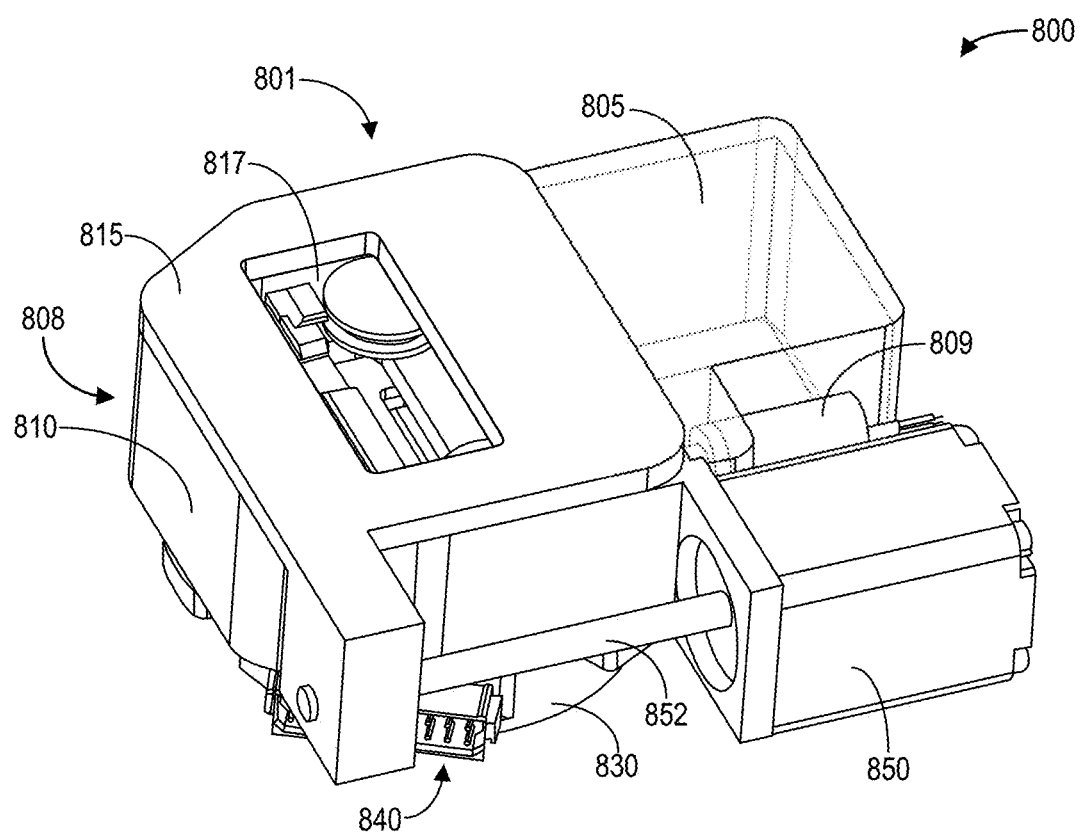
FIG. 8 shows a diagram illustrating a perspective view of an example sample transfer capsule in a first configuration, according to an example.
Figure 9:
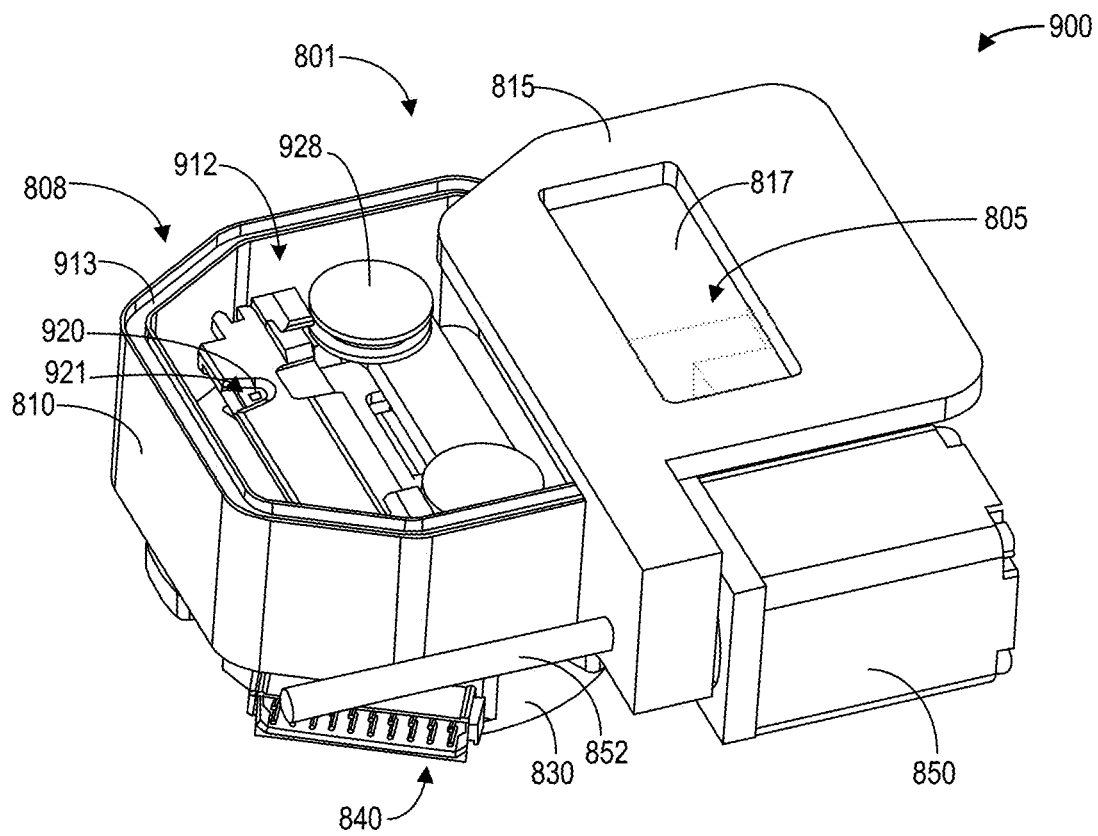
FIG. 9 shows a diagram illustrating a perspective view of the sample transfer capsule of FIG. 8 in a second configuration, according to an example.
Figure 10:
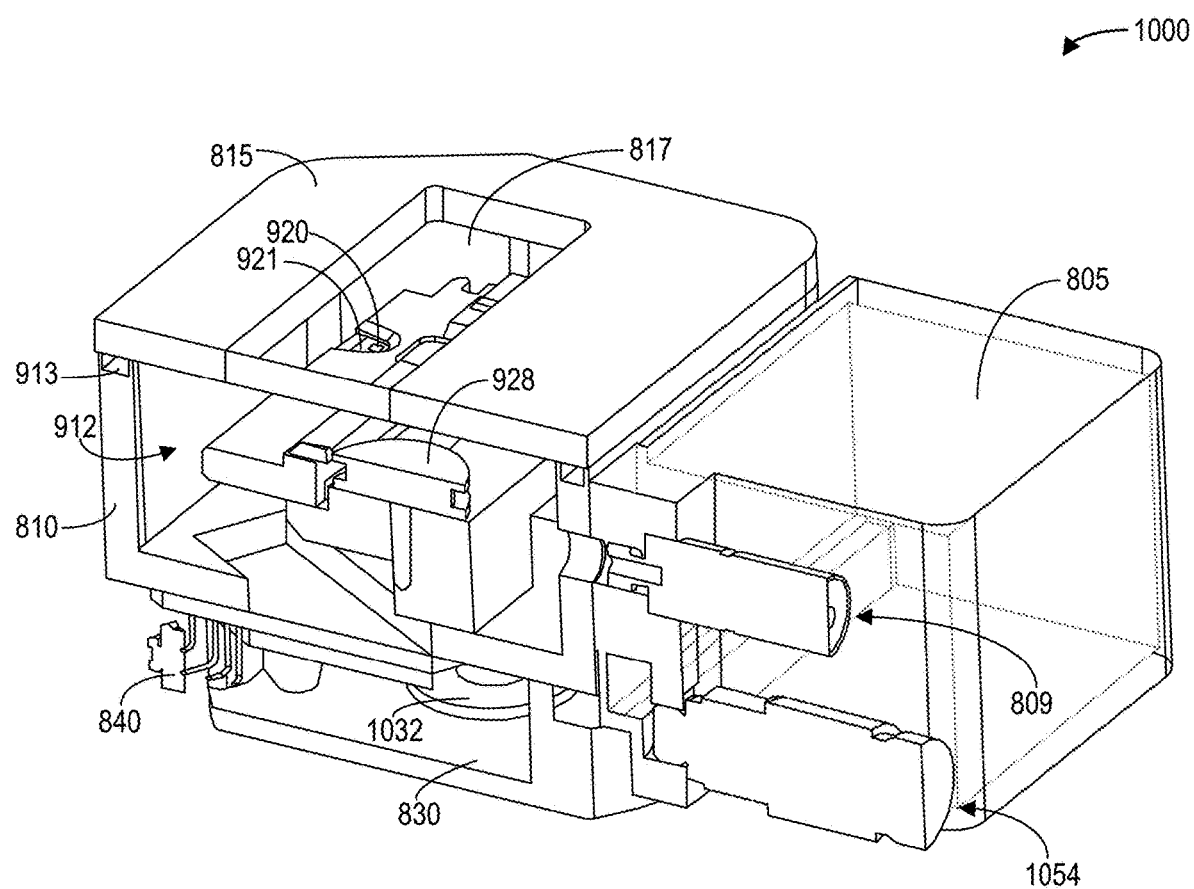
FIG. 10 shows a diagram illustrating a perspective cross-sectional view of the sample transfer capsule of FIG. 8, according to an example.

Although the sample transfer capsules described hereinabove are docked in a holder within the beam system while the sample is being processed by the beam system, it should be appreciated that in some examples, the sample transfer capsule may be docked on the stage while the sample is imaged and/or shaped. As an illustrative and non-limiting example, FIGS. 8-10 illustrate an example sample transfer 801 that may be mounted on a stage during imaging and/or shaping of a sample 920. In particular, FIG. 8 shows a diagram illustrating a perspective view 800 of an example sample transfer capsule 801 in a first, closed configuration, and FIG. 9 shows a diagram illustrating a perspective view 900 of the sample transfer capsule 801 in a second, open configuration, according to an example. FIG. 10 shows a diagram illustrating a perspective cross-sectional view 1000 of the sample transfer capsule 801 in the first, closed configuration. Similar to the sample transfer capsules 201 and 501 described hereinabove, the sample transfer capsule 801 comprises an inert gas container 805 storing inert gas and a container 808 comprising a body 810 forming a sample volume 912. The sample transfer capsule 801 further comprises a valve 809 configured to allow flow of inert gas from the inert gas container 805 to the sample volume 912. The valve 809 may be electrically or pneumatically driven to allow selective control of the valve 809. The sample 920 is positioned within the sample volume 912. The sample 920 may be positioned on a stub 928, or on an in-operando holder 921. The in-operando holder 921 can be used to stimulate the sample 920 during imaging or processing by the charged particle beam. The sample 920 can be stimulated for example by electric field, magnetic field, electromagnetic waves, or by heating/cooling on the in-operando holder 921. For example, the in-operando holder 921 can be equipped with multiple contacts in the sample area, enabling electrical connection of the sample 920 with a testing device placed outside of the vacuum chamber. In this example, the in-operando holder 921 can be used, as an illustrative and non-limiting example, for electrical biasing of the sample 920 and for sensing of signals coming from the sample 920.

The sample transfer capsule 801 further comprises a platform or lid 815 adapted to cover and seal the sample volume 912 of the container 808 in the first, closed configuration, where in some examples a gasket (not shown) such as an O-ring may be placed in the cavity 913 surrounding a top of the sample volume 912 to seal the sample volume 912 when the lid 815 is in the first configuration. The lid 815 may include a window 817 comprising vacuum-sealed glass. The sample transfer capsule 801 further comprises a motor 850 coupled to the lid 815, where the motor 850 is controllable to adjust the lid 815 between the first, closed configuration depicted in FIG. 8 and the second, open configuration depicted in FIG. 9, such that the sample volume 912 is exposed via the open side or open portion of the container 808. The motor 850 may be coupled to the lid 815 via a shaft 852, as an illustrative and non-limiting example.

The sample transfer capsule 801 further comprises a stage platform 830 with a stage adaptor 1032 for securely coupling the sample transfer capsule 801 to a stage, such as the stage or positioning system 110. In addition to the valve 809 for flowing inert gas from the inert gas container 805 to the sample volume 912, the sample transfer capsule 801 further comprises a valve 1054 for filling the inert gas container 805.

The sample transfer capsule 801 further comprises an electrical connection 840 that may be electrically coupled to a cable (not shown) connected through a beam system feedthrough, as an example. The electrical connection 840 may provide electrical power and control of the in-operando holder 921, for example, and in some examples may further provide electrical power and control to one or more of the motor 850, the valve 809, the valve 1054, and any electrical device inside the sample volume 912 (e.g., pressure gauge (s), sensor(s), and so on). For example, the sample transfer capsule 801 may be electrically and communicatively coupled to the controller 128, for example, via the electrical connection 840. In this way, one or more of the valve 809, the motor 850, the in-operando holder 921, and the valve 1054 may be controlled to perform one or more actions. For example, the controller 128 may command the motor 850 to open the lid 815 to allow imaging and/or other processing of the sample 920. After such processing of the sample 920, the controller 128 may further command the motor 850 to close the lid 815, and then the controller 128 may command the valve 809 to open such that inert gas flows from the inert gas container 805 to the sample space 912. Thus, the electrical connection 840 of the sample transfer capsule 801 enables the sample transfer capsule 801 to provide an inert gas environment for the sample 920 during transfer without controlling the position of the stage 110.

Figure 11:
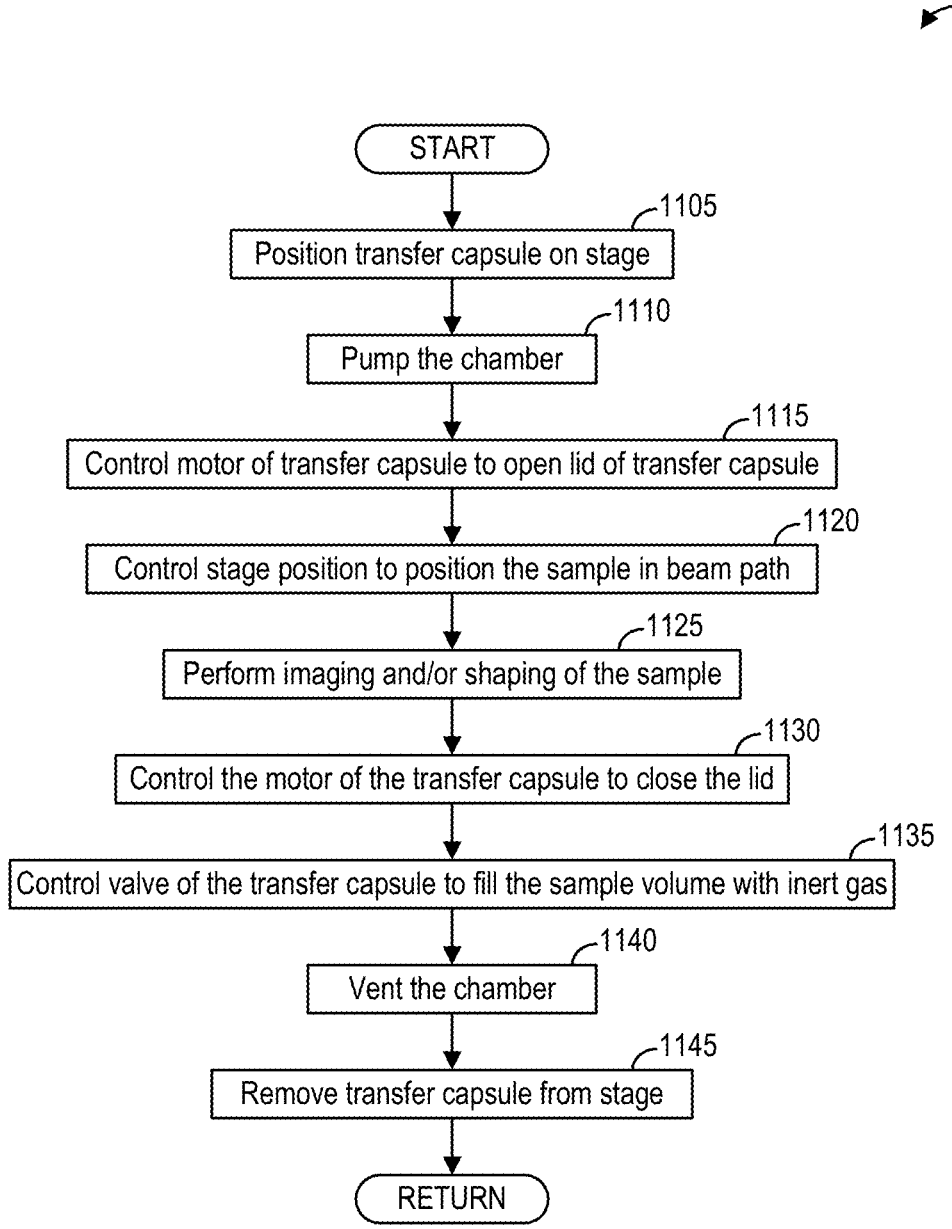
FIG. 11 shows a high-level flow chart illustrating an example method for transferring a sample with the sample transfer capsule of FIG. 8 for imaging with a beam system, according to an example.

To illustrate the use of the sample transfer capsule 801 for transferring samples under an inert gas environment, FIG. 11 shows a high-level flow chart illustrating an example method 1100 for transferring a sample with the sample transfer capsule 801 for imaging and/or shaping with a beam system, such as the beam system 100. Method 1100 may be implemented as executable instructions stored in non-transitory memory of the controller 128 that when executed by the controller 128 cause the controller 128 to perform the actions described herein, as an illustrative and non-limiting example.

Method 1100 begins at 1105. At 1105, method 1100 positions the transfer capsule or sample transfer apparatus on the stage of the beam system. For example, an operator may manually position the sample transfer capsule 801 on the stage or positioning system 110 of the dual-beam system 100. In other examples, method 1100 may automatically control a robotic arm, as an illustrative and non-limiting example, to position the sample transfer capsule 801 on the positioning system 110. The sample transfer capsule 801 may be coupled to the stage via the stage platform adaptor 1032. Further, the sample transfer capsule 801 is in a closed configuration wherein the lid 815 covers and seals the sample volume 912, wherein the sample volume 912 is filled with an inert gas. Prior to positioning the sample transfer capsule 801 on the stage or after positioning the sample transfer capsule 801 on the stage, a cable may be coupled to the electrical connection 840 of the sample transfer capsule 801 to provide electrical communication with the sample transfer capsule 801 and a controller, such as the controller 128 of the beam system 100.

At 1110, method 1100 controls a pump, such as the vacuum pump 180, to pump the vacuum chamber 108 of the beam system 100. After evacuating the vacuum chamber 108 with the vacuum pump 180, method 1100 continues to 1115. At 1115, method 1100 controls the motor 850 of the sample transfer capsule 801 to open the lid 815 of the sample transfer capsule 801. The inert gas within the sample volume 912 may thus dissipate within the vacuum chamber 108 and may also be evacuated via the vacuum pump 180 if method 1100 continues to control the vacuum pump 180 when the lid 815 is opened.

At 1120, method 1100 controls the stage position to position the sample 920 in the beam path. For example, method 1100 may control the positioning system 110 to position the sample 920 within the beam path of the SEM 102 and/or the FIB column 104. At 1125, method 1100 controls the beam system 100 to perform imaging and/or shaping of the sample 920.

After imaging and/or shaping the sample 920, method 1100 continues to 1130. At 1130, method 1100 controls the motor 850 of the sample transfer capsule 801 to close the lid 815. For example, method 1100 controls the motor 850 to adjust the position of the lid 815 to the closed position wherein the lid 815 covers and seals the sample volume 912.

After closing the lid 815 and sealing the sample volume 912, method 1100 continues to 1135. At 1135, method 1100 controls the valve 809 of the sample transfer capsule 801 to fill the sample volume 912 with the inert gas from the inert gas container 805. After replacing the high vacuum in the sample volume 912 with the inert gas, method 1100 continues to 1140, wherein method 1100 vents the vacuum chamber 108.

At 1145, method 1100 removes the sample transfer capsule from the stage. For example, the sample transfer capsule 801 may be manually or automatically removed from the stage or positioning system 110. The sample transfer capsule may then be removed from the vacuum chamber 108 and transported to a glove box, another beam system, and so on, while maintaining the sample 920 in an inert gas environment. Method 1100 then returns.

Thus, various systems, apparatuses, and methods are provided for transferring samples within a sealed inert gas environment to and from a vacuum chamber of a beam system.

In a first example, a sample transfer capsule comprises a container configured to store a sample during transport, wherein the container is adjustable between a closed configuration and an open configuration, an inert gas storage chamber coupled to the container and configured to store an inert gas, and a valve coupled to the inert gas storage chamber and the container and configured to selectively allow the inert gas to flow from the inert gas storage chamber to the container when the container is in the closed configuration.

In a first example of the sample transfer capsule, the sample transfer capsule further comprises a body forming the container with an open portion, and a platform configured to cover the open portion and seal the container in the closed configuration. In a second example of the sample transfer capsule optionally including the first example, the body and platform are configured to form a seal where an inert gas pressure in the container is less than a pressure outside the container, and the seal is configured to be unsealed where a pressure outside of the container is below the inert gas pressure in the container. In a third example of the sample transfer capsule optionally including one or more of the first and second examples, the body and platform comprise respective interlockable mechanisms that seal the container in the closed configuration. In a fourth example of the sample transfer capsule optionally including one or more of the first through third examples, the sample transfer capsule further comprises a motor coupled to the platform, wherein the motor is controllable to move the platform to adjust the container between the open configuration and the closed configuration. In a fifth example of the sample transfer capsule optionally including one or more of the first through fourth examples, the body is configured to dock to a holder in a vacuum chamber of a charged particle beam system while the sample and the platform are positioned within a beam path of the charged particle beam system away from the body. In a sixth example of the sample transfer capsule optionally including one or more of the first through fifth examples, the inert gas storage chamber is docked with the body to the holder or the inert gas storage chamber is coupled to the platform while the body is docked to the holder. In a seventh example of the sample transfer capsule optionally including one or more of the first through sixth examples, the sample transfer capsule further comprises an in-operando holder mounted within the container, wherein the sample is positioned on the in-operando holder, and wherein the sample is exposable to a beam path of a charged particle beam system when the container is in the open configuration. In an eighth example of the sample transfer capsule optionally including one or more of the first through seventh examples, the inert gas comprises argon.

In another example, a system comprises a sample transfer capsule configured to transport a sample and a charged particle beam system. In this example, the sample transfer capsule comprises a container configured to store the sample, wherein the container is adjustable between a closed configuration and an open configuration, an inert gas storage chamber coupled to the container and configured to store an inert gas, and a valve coupled to the inert gas storage chamber and the container and configured to selectively allow the inert gas to flow from the inert gas storage chamber to the container when the container is in the closed configuration. Further, in this example, the charged particle beam system comprises at least one column configured to generate and direct a charged particle beam toward the sample, a vacuum chamber, and a stage positioned within the vacuum chamber and movable within the vacuum chamber. In this example system, the sample transfer capsule is mountable to the stage, the container of the sample transfer capsule is configured to adjust from the closed configuration providing an inert gas environment for the sample to the open configuration when gases are evacuated from the vacuum chamber, and the sample is exposable to the charged particle beam when the container is in the open configuration. When the container is in the open configuration, the container may be pumped to vacuum using a pumping system of the vacuum chamber.

In a first example of the system, the sample transfer capsule further comprises a body forming the container with an open portion, and a platform configured to cover the open portion and seal the container in the closed configuration. In a second example of the system optionally including the first example, the charged particle beam system further comprises a holder mounted within the vacuum chamber, wherein the platform is detachable from the body of the sample transfer capsule, and wherein the body of the sample transfer capsule is dockable with the holder to secure the sample transfer capsule away from the charged particle beam. In a third example of the system optionally including one or more of the first and second examples, the platform attaches and seals to the body of the sample transfer capsule when an inert gas pressure in the container is less than an atmospheric pressure surrounding the sample transfer capsule. In a fourth example of the system optionally including one or more of the first through third examples, the platform is interlockable with the body via corresponding interlocking mechanisms of the platform and the body, wherein the platform attaches and seals to the body of the sample transfer capsule when the platform is locked onto the body via the corresponding interlocking mechanisms of the platform and the body. In a fifth example of the system optionally including one or more of the first through fourth examples, the sample transfer capsule further comprises a motor coupled to the platform and configured to move the platform to adjust the container between the open configuration and the closed configuration.

In yet another example, a method comprises positioning a sample transfer capsule within a vacuum chamber of a charged particle beam system, wherein the sample transfer capsule seals a sample within a container of the sample transfer capsule filled with inert gas, pumping the vacuum chamber to create a vacuum within the vacuum chamber, opening the sample transfer capsule to expose the sample to a charged particle beam, closing the sample transfer capsule to seal the sample within the sample transfer capsule, opening a valve of the sample transfer capsule to fill the container with the inert gas from an inert gas storage chamber of the sample transfer capsule, and removing the sample transfer capsule from the vacuum chamber.

In a first example of the method, opening the sample transfer capsule to expose the sample to the charged particle beam comprises controlling a stage of the vacuum chamber to dock the container and the inert gas storage chamber of the sample transfer capsule in a holder mounted within the vacuum chamber, controlling the stage to detach a platform of the sample transfer capsule from the container, wherein the sample is positioned on the platform, and controlling the stage to position the sample within a path of the charged particle beam. In a second example of the method optionally including the first example, controlling the stage to detach the platform from the container comprises selectively moving the stage and/or holder to unlock the platform from the container. In a third example of the method optionally including one or more of the first and second examples, controlling the stage to detach the platform from the container comprises lowering the stage after a vacuum pressure of the vacuum chamber is lower than an inert gas pressure within the container. In a fourth example of the method optionally including one or more of the first through third examples, opening the sample transfer capsule to expose the sample to the charged particle beam comprises controlling a motor of the sample transfer capsule to open a lid of the sample transfer capsule, and wherein closing the sample transfer capsule to seal the sample within the sample transfer capsule comprises controlling the motor of the sample transfer capsule to close the lid of the sample transfer capsule. In a fifth example of the method optionally including one or more of the first through fourth examples, opening the valve of the sample transfer capsule to fill the container with the inert gas from the inert gas storage chamber of the sample transfer capsule comprises one of electrically, pneumatically, or mechanically actuating the valve to open.

The description uses the phrases "an example," "various examples," and "some examples," each of which may refer to one or more of the same or different examples. Furthermore, the terms "comprising," "including," "having," and the like, as used with respect to examples of the present disclosure, are synonymous. When used to describe a range of dimensions, the phrase "between X and Y" represents a range that includes X and Y. As used herein, an "apparatus" may refer to any individual device, collection of devices, part of a device, or collections of parts of devices. The drawings are not necessarily to scale.

In view of the many possible examples to which the principles of the disclosed technology may be applied, it should be recognized that the illustrated embodiments are only preferred examples and should not be taken as limiting scope. Rather, the scope of the disclosed technology is defined by the following claims. We therefore claim all that comes within the scope of at least these claims.

We claim:

1. A sample transfer capsule, comprising:
   a container configured to store a sample during transport, wherein the container is adjustable between a closed configuration and an open configuration;
   an inert gas storage chamber coupled to the container and configured to store an inert gas; and
   a valve coupled to the inert gas storage chamber and the container and configured to selectively allow the inert gas to flow from the inert gas storage chamber to the container when the container is in the closed configuration.

2. The sample transfer capsule of claim 1, further comprising a body forming the container with an open portion, and a platform configured to cover the open portion and seal the container in the closed configuration.

3. The sample transfer capsule of claim 2, wherein the body and platform are configured to form a seal where an inert gas pressure in the container is less than a pressure outside the container, and wherein the seal is configured to be unsealed where a pressure outside of the container is below the inert gas pressure in the container.

4. The sample transfer capsule of claim 2, wherein the body and platform comprise respective interlockable mechanisms that seal the container in the closed configuration.

5. The sample transfer capsule of claim 2, further comprising a motor coupled to the platform, wherein the motor is controllable to move the platform to adjust the container between the open configuration and the closed configuration.

6. The sample transfer capsule of claim 2, wherein the body is configured to dock to a holder in a vacuum chamber of a charged particle beam system while the sample and the platform are positioned within a beam path of the charged particle beam system away from the body.

7. The sample transfer capsule of claim 2, further comprising an in-operando holder mounted within the container, wherein the sample is positioned on the in-operando holder, and wherein the sample is exposable to a beam path of a charged particle beam system when the container is in the open configuration.

8. The sample transfer capsule of claim 1, wherein the inert gas comprises argon.

9. A system, comprising:
   a sample transfer capsule configured to transport a sample, comprising:
     a container configured to store the sample, wherein the container is adjustable between a closed configuration and an open configuration;
     an inert gas storage chamber coupled to the container and configured to store an inert gas; and
     a valve coupled to the inert gas storage chamber and the container and configured to selectively allow the inert gas to flow from the inert gas storage chamber to the container when the container is in the closed configuration; and
   a charged particle beam system, comprising:
     at least one column configured to generate and direct a charged particle beam toward the sample;
     a vacuum chamber; and
     a stage positioned within the vacuum chamber and movable within the vacuum chamber;
   wherein the sample transfer capsule is mountable to the stage, wherein the container of the sample transfer capsule is configured to adjust from the closed configuration providing an inert gas environment for the sample to the open configuration, and wherein the sample is exposable to the charged particle beam when the container is in the open configuration.

10. The system of claim 9, wherein the sample transfer capsule further comprises a body forming the container with an open portion, and a platform configured to cover the open portion and seal the container in the closed configuration.

11. The system of claim 10, wherein the charged particle beam system further comprises a holder mounted within the vacuum chamber, wherein the platform is detachable from the body of the sample transfer capsule, and wherein the body of the sample transfer capsule is dockable with the holder to secure the sample transfer capsule away from the charged particle beam.

12. The system of claim 11, wherein the platform attaches and seals to the body of the sample transfer capsule when an inert gas pressure in the container is less than an atmospheric pressure surrounding the sample transfer capsule.

13. The system of claim 11, wherein the platform is interlockable with the body via corresponding interlocking mechanisms of the platform and the body, wherein the platform attaches and seals to the body of the sample transfer capsule when the platform is locked onto the body via the corresponding interlocking mechanisms of the platform and the body.

14. The system of claim 10, wherein the sample transfer capsule further comprises a motor coupled to the platform and configured to move the platform to adjust the container between the open configuration and the closed configuration.

15. A method, comprising:
 positioning a sample transfer capsule within a vacuum chamber of a charged particle beam system, wherein the sample transfer capsule seals a sample within a container of the sample transfer capsule filled with inert gas;
 pumping the vacuum chamber to create a vacuum within the vacuum chamber;
 opening the sample transfer capsule to expose the sample to a charged particle beam;
 closing the sample transfer capsule to seal the sample within the sample transfer capsule;
 opening a valve of the sample transfer capsule to fill the container with the inert gas from an inert gas storage chamber of the sample transfer capsule; and
 removing the sample transfer capsule from the vacuum chamber.

16. The method of claim 15, wherein opening the sample transfer capsule to expose the sample to the charged particle beam comprises:
 controlling a stage of the vacuum chamber to dock the container and the inert gas storage chamber of the sample transfer capsule in a holder mounted within the vacuum chamber;
 controlling the stage to detach a platform of the sample transfer capsule from the container, wherein the sample is positioned on the platform; and
 controlling the stage to position the sample within a path of the charged particle beam.

17. The method of claim 16, wherein controlling the stage to detach the platform from the container comprises selectively moving the stage and/or holder to unlock the platform from the container.

18. The method of claim 16, wherein controlling the stage to detach the platform from the container comprises lowering the stage after a vacuum pressure of the vacuum chamber is lower than an inert gas pressure within the container.

19. The method of claim 15, wherein opening the sample transfer capsule to expose the sample to the charged particle beam comprises controlling a motor of the sample transfer capsule to open a lid of the sample transfer capsule, and wherein closing the sample transfer capsule to seal the sample within the sample transfer capsule comprises controlling the motor of the sample transfer capsule to close the lid of the sample transfer capsule.

20. The method of claim 15, wherein opening the valve of the sample transfer capsule to fill the container with the inert gas from the inert gas storage chamber of the sample transfer capsule comprises one of electrically, pneumatically, or mechanically actuating the valve to open.

* * * * *